United States Patent
Kim et al.

(10) Patent No.: US 10,748,642 B2
(45) Date of Patent: Aug. 18, 2020

(54) MEMORY CONTROLLER, METHOD OF OPERATING THE SAME AND STORAGE DEVICE INCLUDING THE MEMORY CONTROLLER

(71) Applicant: SAMSUNG ELECTRONICS CO., LTD., Suwon-si (KR)

(72) Inventors: Kwang-hoon Kim, Uiwang-si (KR); Jun-jin Kong, Yongin-si (KR); Hong-rak Son, Anyang-si (KR); Pil-sang Yoon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/299,348

(22) Filed: Mar. 12, 2019

(65) Prior Publication Data

US 2019/0287643 A1 Sep. 19, 2019

(30) Foreign Application Priority Data

Mar. 14, 2018 (KR) ........................ 10-2018-0029926

(51) Int. Cl.
| | |
|---|---|
| *G11C 7/06* | (2006.01) |
| *G11C 16/26* | (2006.01) |
| *G11C 29/50* | (2006.01) |
| *G11C 11/56* | (2006.01) |
| *G11C 16/34* | (2006.01) |
| *G11C 29/02* | (2006.01) |
| *G11C 29/04* | (2006.01) |

(52) U.S. Cl.
CPC .......... *G11C 29/50004* (2013.01); *G11C 7/06* (2013.01); *G11C 11/5642* (2013.01); *G11C 16/26* (2013.01); *G11C 16/3459* (2013.01); *G11C 29/028* (2013.01); *G11C 2029/0405* (2013.01)

(58) Field of Classification Search
CPC .......... G11C 29/50004; G11C 11/5642; G11C 16/3459; G11C 29/028; G11C 16/26; G11C 2029/0405; G11C 29/021
See application file for complete search history.

(56) References Cited

U.S. PATENT DOCUMENTS

| | | | |
|---|---|---|---|
| 7,936,601 | B2 | 5/2011 | Kang et al. |
| 8,422,307 | B2 | 4/2013 | Yoo et al. |
| 8,804,421 | B2 | 8/2014 | Motwani |
| 9,111,626 | B2 | 8/2015 | Kim et al. |
| 9,128,812 | B2 | 9/2015 | Seol et al. |
| 9,478,300 | B2 | 10/2016 | Kim et al. |
| 9,542,258 | B1 | 1/2017 | Lu et al. |

(Continued)

*Primary Examiner* — Ajay Ojha
(74) *Attorney, Agent, or Firm* — Sughrue Mion, PLLC

(57) ABSTRACT

A method of setting a read voltage by a memory controller and a storage device are provided. The method includes controlling a memory device to read data from memory cells by applying a test read voltage to a selected word line; receiving, from the memory device, cell count information corresponding to a read operation of the memory device, and renewing the test read voltage by using the cell count information and a cost function to find an optimum read voltage, the cost function being determined for each read voltage level; and determining a read voltage by performing the controlling of the memory device and the renewing of the test read voltage at least once.

20 Claims, 17 Drawing Sheets

(56) References Cited

U.S. PATENT DOCUMENTS

| | | |
|---|---|---|
| 9,552,887 B2 | 1/2017 | Kim et al. |
| 9,595,320 B2 | 3/2017 | Wu et al. |
| 9,747,993 B2 | 8/2017 | Lee |
| 2010/0214853 A1* | 8/2010 | Kang .................... G11O 5/147 365/189.07 |
| 2010/0296350 A1* | 11/2010 | Kim .................... G11C 11/5642 365/189.15 |
| 2016/0329105 A1* | 11/2016 | Kim .................... G11C 11/5642 |
| 2017/0125110 A1 | 5/2017 | Sankaranarayanan et al. |

* cited by examiner

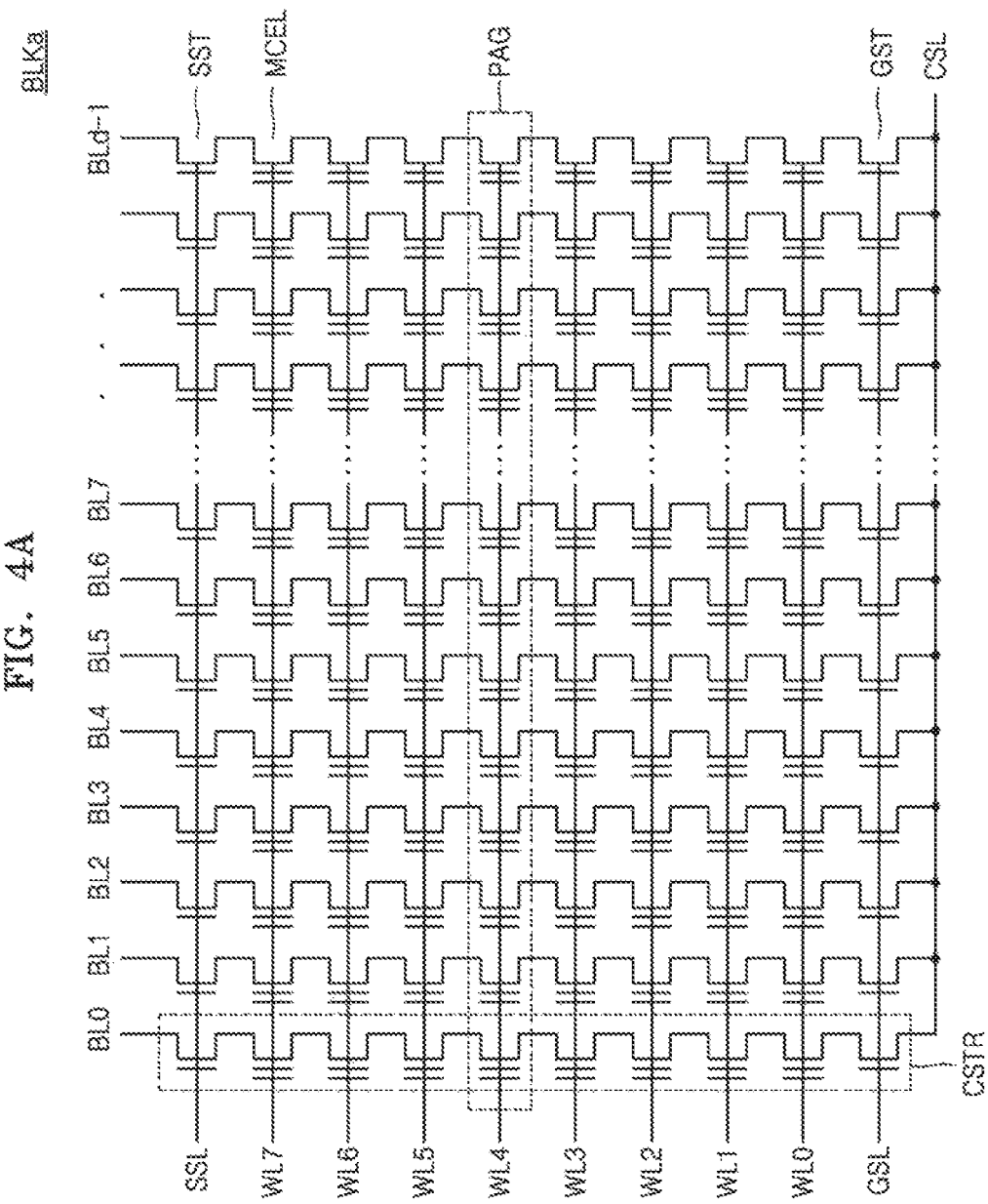

FIG. 12A

| Initial Threshold voltage Distribution Information (ITD_INFO) ||
|---|---|
| STATE | REFERENCE CELL COUNT |
| ERASE | CC_REF_1 |
| P1 | CC_REF_2 |
| P2 | CC_REF_3 |
| P3 | CC_REF_4 |
| ⋮ | ⋮ |

FIG. 12B

| Initial Threshold voltage Distribution Information (ITD_INFO) ||
|---|---|
| WORD LINE | REFERENCE CELL COUNT |
| WL1 | CC_REF_1 |
| WL2 | CC_REF_2 |
| WL3 | CC_REF_3 |
| WL4 | CC_REF_4 |
| ⋮ | ⋮ |

MEMORY CONTROLLER, METHOD OF OPERATING THE SAME AND STORAGE DEVICE INCLUDING THE MEMORY CONTROLLER

CROSS-REFERENCE TO RELATED APPLICATION

This application claims priority to Korean Patent Application No. 10-2018-0029926, filed on Mar. 14, 2018, in the Korean Intellectual Property Office, the disclosure of which is incorporated by reference herein in its entirety.

BACKGROUND

1. Field

Methods, apparatuses, and devices consistent with the present disclosure relate to a memory controller and a storage device, and more particularly, to a method of setting a read voltage of a memory controller, a method of controlling the memory controller, and a storage device including the memory controller.

2. Description of Related Art

Semiconductor memory devices are classified into volatile memory devices that lose stored data when their power supply is interrupted and non-volatile memory devices that do not lose stored data even when their power supply is interrupted. Although data may be quickly written to or read from volatile semiconductor memory devices, when the devices' power supply is interrupted, stored data is erased. On the other hand, although data is read from or written to non-volatile memory devices more slowly than volatile memory devices, even when the devices are out of power, stored data is preserved.

As an example of a non-volatile memory device, in a flash memory device, as a bit rate of data stored in one memory cell increases, it is required that a threshold voltage distribution of memory cells included in the device is more elaborately formed. When the threshold voltage distribution is formed at a location different from an expected position, defects like read errors may be caused. Besides a method of improving reliability in data read operations by elaborately forming a threshold voltage distribution, in a case where the threshold voltage distribution is degraded, there are provided various methods of performing data read operations with high reliability after recognizing the degradation of the threshold voltage distribution.

SUMMARY

It is an aspect to provide a method of setting a read voltage of a memory controller, a method of controlling the memory controller, and a storage device including the memory controller, and more particularly, methods and an apparatus for performing read operations with high reliability even when a threshold voltage distribution of memory cells is degraded.

According to an aspect of an example embodiment, there is provided a method of setting a read voltage by a memory controller, the method comprising controlling a memory device to read data from a plurality of memory cells by applying a test read voltage to a selected word line; receiving, from the memory device, cell count information corresponding to a read operation of the memory device, and renewing the test read voltage by using the cell count information and a cost function to find an optimum read voltage, the cost function being determined for each read voltage level; and determining the read voltage of the memory device by performing the controlling of the memory device and the renewing of the test read voltage at least once.

According to another aspect of an example embodiment, there is provided a method of operating by a memory controller configured to control a memory device including a plurality of memory cells connected to a plurality of word lines, the method comprising detecting one or more uncorrectable error correction code errors that have occurred in a selected word line among the plurality of word lines; performing at least one iteration loop until an interruption condition is generated, the at least one iteration loop being performed based on an arbitrary initial read voltage; and determining an optimum read voltage by using a result of the performing of the at least one iteration loop, and controlling the memory device to perform a read operation based on the optimum read voltage that is determined, wherein the at least one iteration loop comprises controlling the memory device to perform a test read operation by applying a test read voltage to the selected word line; receiving, from the memory device, cell count information generated by the test read operation; and renewing the test read voltage by using a cost function and the cell count information, the cost function being determined based on an initial threshold voltage distribution of memory cells connected to the selected word line.

According to another aspect of an example embodiment, there is provided a storage device comprising a memory device configured to perform a test read operation by applying a test read voltage to a selected word line, based on a read command signal received from a memory controller, and to transmit cell count information, by performing a cell counting operation according to a performance of the test read operation; the memory controller configured to set an optimum read voltage of a plurality of memory cells, in an operation mode for setting the optimum read voltage of the plurality of memory cells connected to the selected word line, by recursively performing an operation set comprising renewing the test read voltage based on a cost function determined for different read voltage levels and the cell count information received from the memory device, to find an optimum read operation of the memory device, and controlling the test read operation of the memory device based on the test read voltage that is renewed.

BRIEF DESCRIPTION OF THE DRAWINGS

Example embodiments will be more clearly understood from the following detailed description taken in conjunction with the accompanying drawings in which:

FIGS. 4A and 4B respectively show memory blocks according to example embodiments;

FIGS. 12A and 12B respectively show initial threshold voltage distribution information;

DETAILED DESCRIPTION

Example embodiments will now be described more fully hereinafter with reference to the accompanying drawings, in which elements of the example embodiments are shown.

Figure 1:
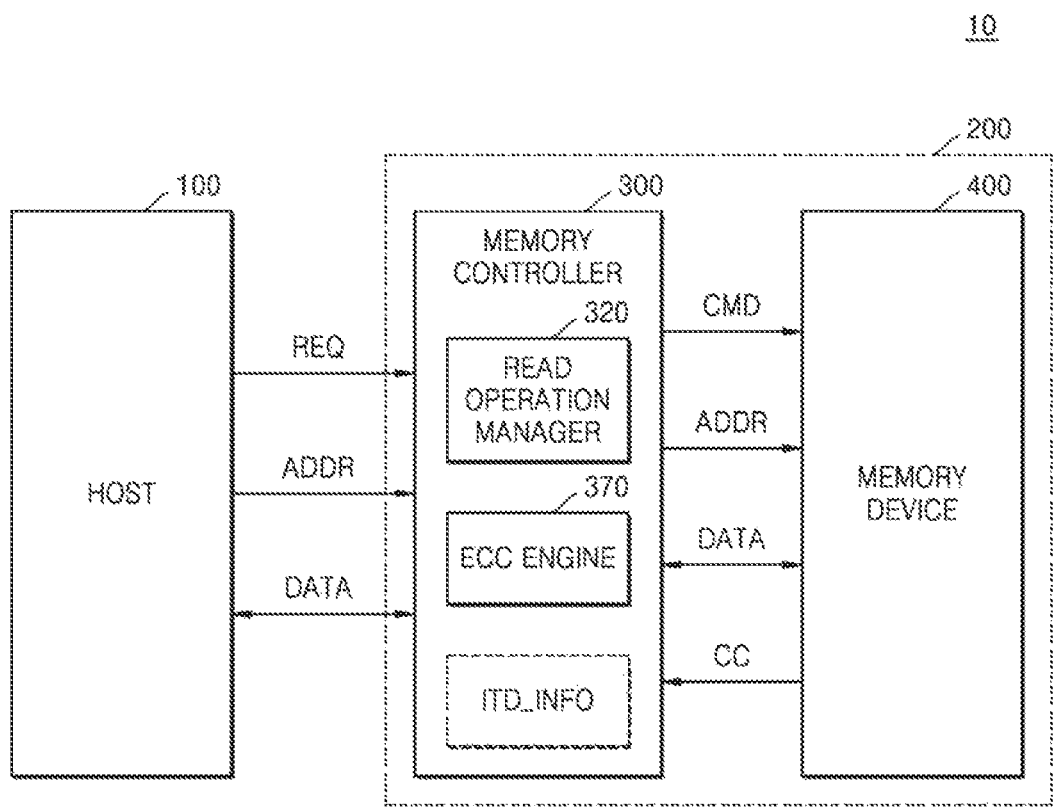
FIG. 1 shows a system according to an example embodiment.

FIG. 1 shows a system 10 according to an example embodiment. The system 10 may include a host 100 and a memory system 200, and the memory system 200 may include a memory controller 300 and a memory device 400. The system 10 may be provided as one of various computing systems including an ultra mobile PC (UMPC), a workstation, a Netbook, a personal digital assistant (PDA), a portable computer, a web tablet, a wireless phone, a mobile phone, a smart phone, an e-book, a portable multimedia player (PMP), a handheld game console, a navigation system, a black box, and a digital camera, and so on.

Each of the host 100, the memory controller 300, and the memory device 400 may be provided as a chip, a package, or a module, and so on. However, the aforementioned components are not limited thereto, and for example, the memory controller 300, together with the host 100, may be provided as an application processor. As another example, the memory controller 300, together with the memory device 400, may be provided as the memory system 200 or a storage device.

The host 100 may transmit a data operation request REQ and an address ADDR to the memory controller 300, and may also exchange data DATA with the memory controller 300. For example, the host 100 may exchange data with the memory controller 300, based on at least one of various interface protocols, like a Universal Serial Bus (USB) protocol, a multi-media card (MMC) protocol, a peripheral component interconnect (PCI) protocol, a PCI-Express (PCI-E) protocol, an advanced technology attachment (ATA) protocol, a serial-ATA protocol, a parallel-ATA protocol, a small computer system interface (SCSI) protocol, an enhanced small device interface (ESDI) protocol, an integrated drive electronics (IDE) protocol, a Mobile Industry Processor Interface (MIPI) protocol, and a Universal Flash Storage (UFS) protocols, and so on.

The memory controller 300 may control the memory device 400. For example, the memory controller 300 may, in response to a data operation request REQ received from the host 100, control the memory device 400 to read data from the memory device 400 or write data to the memory device 400. The memory controller 300 may, by providing an address ADDR, a command CMD, and control signals to the memory device 400, control write, read, and erase operations of the memory device 400. In addition, data DATA for the aforementioned operations may be transmitted or received between the memory controller 300 and the memory device 400. The memory controller 300 may receive cell count information CC from the memory device 400. The cell count information CC may indicate information about results of reading data, by the memory device 400, by using a test read voltage.

The memory controller 300 may include a read operation manager 320 and an error correcting code (ECC) engine 370. The ECC engine 370 may correct errors. An error bit exceeding error correction capacity of the ECC engine 370 is referred to as an uncorrectable error correction code error (UECC error), and data including the UECC error is referred to as UECC data. When the ECC engine 370 detects data including UECC data, the read operation manager 320 may perform an operation of setting an optimum read voltage. For example, the read operation manager 320 may control the memory device 400 to perform a test read operation by using the test read voltage, and may, by receiving the cell count information CC from the memory device 400, renew the test read voltage by using a cost function, which is determined based on the initial threshold voltage distribution of the memory cells, and the cell count information CC. The read operation manager 320 may determine an optimum read voltage by performing the aforementioned operation at least once, or by performing the aforementioned operation recursively until iteration interruption conditions occurs.

The cost function, which is a function defined to find an optimum voltage, may be an unknown function for the test read voltage. The cost function, which is a function used for searching an optimum read voltage of a certain level, may be differently determined according to read voltage levels. In an example embodiment, the cost function may be determined for different read voltage levels, based on an accumulation distribution function and an initial threshold voltage distribution of the memory cells.

The read operation manager 320 may be implemented as hardware including, for example, circuits, and may also be implemented as software including a plurality of programs and stored in the memory controller 300. Also, when the read operation manager 320 is implemented as software, the read operation manager 320 may be implemented as a part of functions of a flash translation layer (FTL) and may be executed by a processor. However, the implementation of the read operation manager 320 is not limited thereto, and for example, the read operation manager 320 may also be implemented as combinations of hardware and software.

The memory controller 300 may store initial threshold voltage distribution information ITD_INFO used by the read operation manager 320 to determine a cost function. The read operation manager 320 may determine the cost function, based on the initial threshold voltage distribution information ITD_INFO stored in the memory controller 300.

The memory device 400 may include at least one memory cell array. The memory cell array may include a plurality of memory cells arranged in an area where a plurality of word lines and a plurality of bit lines cross one another, and the plurality of memory cells may be non-volatile memory cells. Each of the memory cells may be a multi-level cell storing data equal to or greater than 2 bit. For example, each of the memory cells may be a 2 bit multi-level cell storing 2 bits of data, a triple level cell (TLC) storing 3 bit of data, a quadruple level cell (QLC) storing 4 bit of data, or a multi-level cell storing data greater than the aforementioned data. However, the inventive concept is not limited thereto, and for example, some memory cells may be single-level cells (SLC) storing 1 bit of data, and some other memory cells may be multi-level cells. The memory device 400 may include NAND flash memory, vertical NAND, NOR flash memory, resistive random access memory (RRAM), magnetoresistive random access memory (MRAM), ferroelectric random access memory (FRAM), and spin transfer torque random access memory (STT-RAM), and combinations thereof. The memory device 400 may, in response to signals received from the memory controller 300, perform write, read, erase operations with respect to data DATA.

The memory device 400 may, under control of the memory controller 300, perform a test read operation by using the test read voltage, and may transmit cell count information CC, which is generated by using data read by performing the test read operation, to the memory controller 300. For example, the memory device 400 may transmit, to the memory controller 300, cell count information CC along with a response signal in response to a status command signal received from the memory controller 300. This kind of method of transmitting, which is performed by the memory device 400, is referred to as a status command method.

According to an example embodiment, the memory controller 300 may set an optimum read voltage by recursively renewing the test read voltage by using a characteristic of the cost function, which is determined based on the initial threshold voltage distribution of the memory cells, and, the memory device 400 may, by performing a read operation by using the optimum read voltage, improve reliability of the read operation.

Also, the memory controller 300 may perform at least one iteration loop to renew the test read voltage. The memory controller 300 may, according to the situation, flexibly perform the read voltage setting operation. For example, when a period of time provided for the memory controller 300 to perform the read voltage setting operation is not long enough, the memory controller 300 may set the read voltage by performing the iteration loop only a few times. As another example, when the memory controller 300 is provided with sufficient time to perform the read voltage operation, the memory controller 300 may, by performing the iteration loop more than a few times, set the read voltage with higher reliability.

Figure 2:
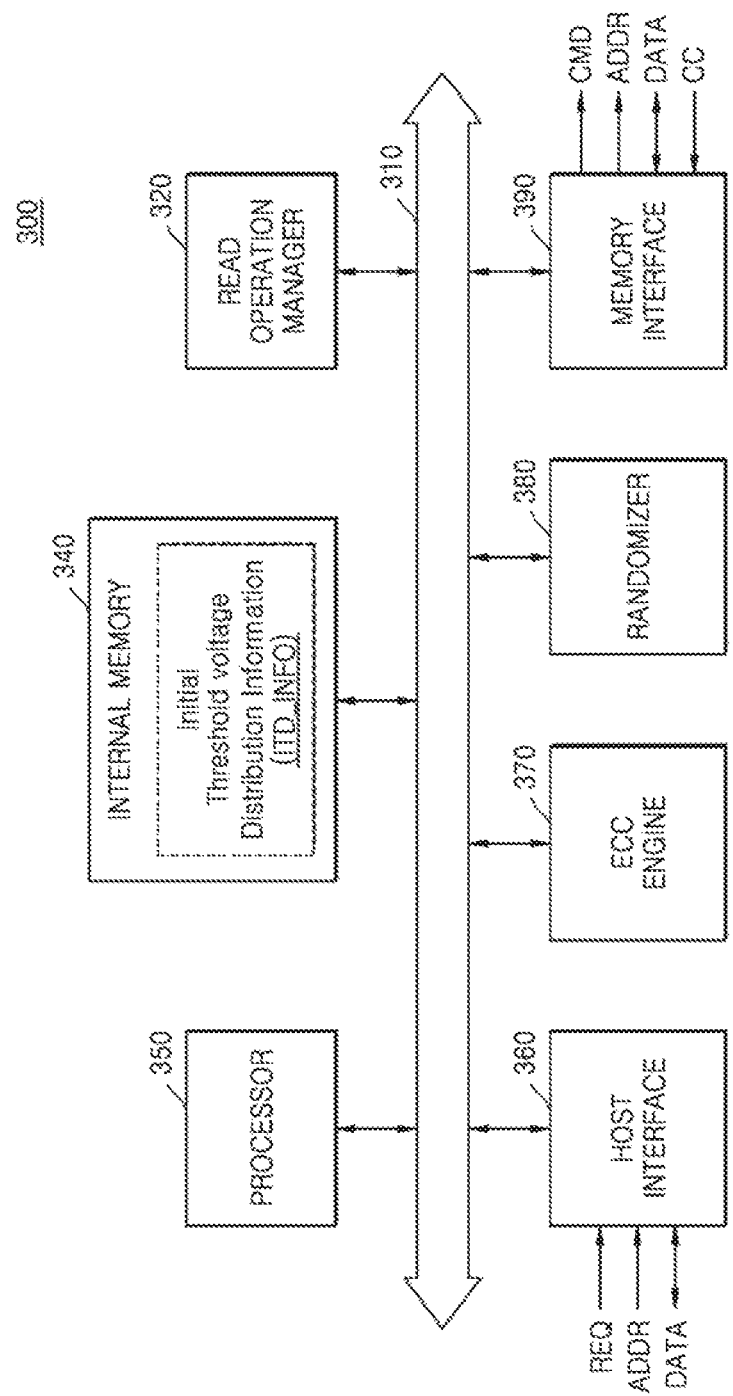
FIG. 2 shows a memory controller according to an example embodiment.

FIG. 2 shows the memory controller 300 according to an example embodiment. The memory controller 300 may include a bus 310, the read operation manager 320, an internal memory 340, a processor 350, a host interface 360, the ECC engine 370, a randomizer 380, and a memory interface 390. The memory controller 300 may further include various components, for example, a command generation module generating commands CMDs for controlling memory operations. In the description of the memory controller 300, descriptions overlapping with those of FIG. 1 are omitted for conciseness.

The bus 310 may provide channels between components included in the memory controller 300. The bus 310 may be operated based one of various bus protocols.

The read operation manager 320 may manage read operations of the memory device 400. When the ECC engine 370 detects data including UECC data, the read operation manager 320 may perform an operation of setting an optimum read voltage. The read operation manager 320 may set the optimum read voltage, and may improve reliability of the read operation by the memory device, by controlling the memory device to perform read operations by using the optimum read voltage.

An operation set may include a first operation, controlling the memory device by using the test read voltage so that the memory device may perform the test read operation, and a second operation, renewing the test read voltage by using the cost function, determined based on the initial threshold voltage distribution of the memory cells, and the cell count information CC by receiving the cell count information CC from the memory device. The read operation manager 320 may set the optimum read voltage by performing at least one iteration of the operation set, or by recursively performing the operation set. The method of setting the optimum read voltage will be described in more detail with reference to the attached drawings.

The internal memory 340 may store various information used for operations of the memory controller 300. To store the information, the internal memory 340 may be implemented by using various memory devices, and may be implemented by using at least one of cache memory, DRAM, SRAM, PRAM, and flash memory devices. The internal memory 340 may store the initial threshold voltage distribution information ITD_INFO. The initial threshold voltage distribution information ITD_INFO may be described in more detail with reference to FIGS. 12A and 12B.

The processor 350 may control overall operations of the memory controller 300. The processor 350 may include a central processing unit (CPU) or a microprocessor. The processor 350 may drive firmware for controlling the memory controller 300, and the firmware may be loaded in the internal memory 340 and be driven.

The host interface 360 may provide an interface between the host 100 and the memory controller 300. The host 100 and the memory controller 300 may exchange data through one of various standardized interfaces. Alternatively, the host 100 and the memory controller 300 may exchange data through a plurality of interfaces from among the various standardized interfaces. The memory controller 300 may, through the host interface 360, receive a data operation request REQ and an address ADDR from the host 100, and may exchange data DATA with the host 100.

The ECC engine 370 may perform error correction operations with respect to data DATA received from the memory device 400. For example, the ECC engine 370 may perform an ECC encoding process and an ECC decoding process by using algorithms, for example, a Reed Solomon (RS) code, a hamming code, and/or a cyclic redundancy code (CRC). The ECC encoding process may include generating parity bits based on target data for programming, and the ECC decoding process may include detecting error bits from data read from the memory device and correcting the detected error bits.

The randomizer 380 may randomize data DATA stored in the memory device 400. For example, the randomizer 380 may randomize the data DATA to be stored in the memory device in word line units. For example, the randomizer 380 may process data so that memory cells connected to one same word line may have program states with identical ratios. For example, when the memory cells connected to one same word line are quadruple level cells (QLC)s respectively storing 4 bit of data, the randomizer 380 may randomize the data DATA so that each of the memory cells may have one of an erase state and first through fifteenth program states.

The memory interface 390 may provide an interface between the memory device 400 and the memory controller 300. For example, data DATA processed by the processor 350 may, through the memory interface 390, be written to the memory device 400. Alternatively, data DATA stored in the memory device 400 may, through the memory interface 390, be provided to the processor 350. The memory controller 300 may, through the memory interface 390, transmit a command CMD and an address ADDR to the memory device 400, receive cell count information CC from the memory device 400, and exchange data DATA with the memory device 400. For example, the memory controller 300 may, through the memory interface 390, receive a distribution determination result from the memory device 400 by the status command method.

According to an example embodiment, the memory controller 300 may set an optimum read voltage by recursively renewing the test read voltage by using a characteristic of the cost function, which is determined based on the initial threshold voltage distribution of the memory cells, and, the memory device 400 may, by performing a read operation by using the optimum read voltage, improve reliability of the read operation.

Also, as the memory controller 300 may perform at least one iteration loop to renew the test read voltage. The memory controller 300 may, according to the situation, flexibly perform the read voltage setting operation. For example, when the memory controller 300 is provided with a short period of time to perform the read voltage setting operation, the memory controller 300 may set the read voltage by performing the iteration loop only a few times. As another example, when the memory controller 300 is provided with sufficient time to perform the read voltage operation, the memory controller 300 may, by performing the iteration loop more than a few times, set the read voltage with higher reliability.

Figure 3:
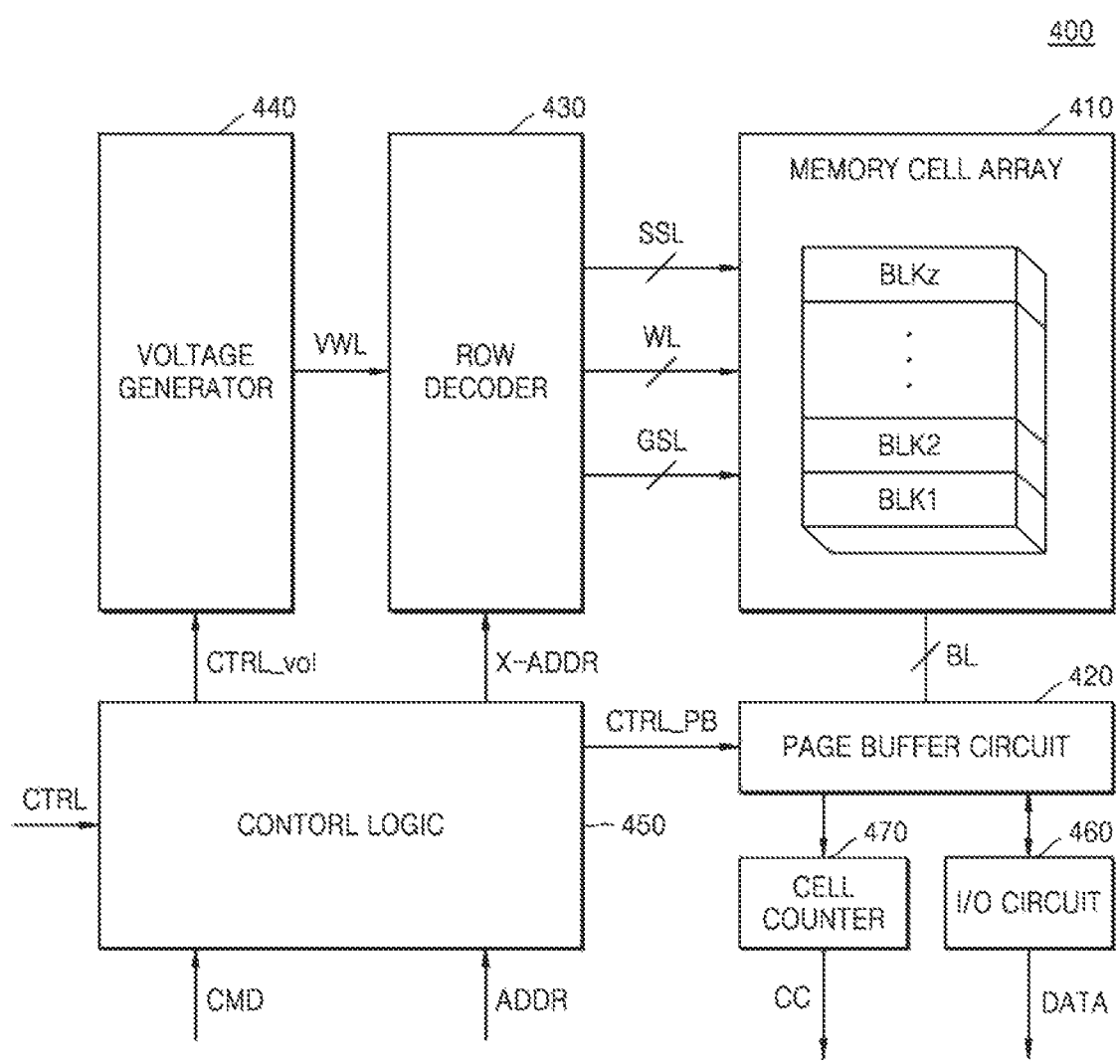
FIG. 3 shows a memory device according to an example embodiment.

FIG. 3 shows the memory device 400 according to an example embodiment. In the description of the memory device 400, descriptions overlapping with those of FIG. 1 are omitted for conciseness.

The memory device 400 may include a memory cell array 410, a page buffer circuit 420, a row decoder 430, a voltage generator 440, a control logic 450, an input/output (I/O) circuit 460, and a cell counter 470.

The memory cell array 410 may include a plurality of memory blocks BLK1 through BLKz. Each of the memory blocks BLK1 through BLKz may include a plurality of memory cells. The memory cell array 410 may be connected to the row decoder 430 through word lines WLs, string selection lines SSLs, and ground selection lines GSLs, and may be connected to the page buffer circuit 420 through bit lines BLs. The memory cell array 410 may include strings respectively connected to the bit lines BLs. Each of the strings may include at least one string selection transistor, a plurality of memory cells, and at least one ground selection transistor serially connected between the bit line BL and a common source line.

The page buffer circuit 420 may be connected to the memory cell array through the bit lines BLs, and may, in response to page buffer control signals CTRL_PBs received from the control logic 450, perform data write operations or data read operations. The page buffer circuit 420 may be connected to data lines by selecting bit lines by using decoded column addresses.

The row decoder 430 may, based on a row-address X-ADDR, select some word lines from among the word lines WLs. The row decoder 430 may transmit a word line application voltage to the word lines WLs. During the data write operation, the row decoder 430 may apply a program voltage and a verification voltage to selected word line, and apply a program inhibit voltage to non-selected word line. During the data read operation, the row decoder 430 may apply a read voltage to selected word line, and a read inhibit voltage to non-selected word line. During the data erase operation, the row decoder 430 may apply a word line erase voltage to the word lines. In addition, the row decoder 430 may, based on the row address X-ADDR, select some string selection lines from among the string selection lines SSLs or select some ground selection lines from among the ground selection lines GSLs.

The voltage generator 440 may, based on the voltage control signal CTRL_vol received from the control logic 450, generate various kinds of voltages to perform write, read, and erase operations with respect to the memory cell array 410. For example, the voltage generator 440 may generate a word line drive voltage VWL to drive the word lines WLs. In this case, the word line drive voltage VWL may include a write voltage, a read voltage, a word line erase voltage, and a write verification voltage, and so on. In addition, the voltage generator 440 may further generate a string selection line drive voltage to drive the string selection lines SSLs and a ground selection line drive voltage to drive the ground selection lines GSLs.

The control logic 450 may, based on a command CMD, an address ADDR, and a control signal CTRL received from the memory controller, generate various kinds of internal control signals to write data to the memory cell array 410 or read data from the memory cell array 410. In other words, the control logic 450 may control overall operations in the memory device 400. The various kinds of internal control signals generated in the control logic 450 may be provided to the page buffer circuit 420, the row decoder 430, and the voltage generator 440, and so on. For example, the control logic 450 may provide page a buffer control signal CTRL_PB to the page buffer circuit 420, provide a row address X-ADDR to the row decoder 430, and provide a voltage control signal CTRL_vol to the voltage generator 440. However, the control signals are not limited thereto, and the control logic 450 may further provide other internal control signals. For example, the control logic 450 may also provide a column address to the column decoder.

While the memory controller performs the optimum voltage setting operation, the control logic 450 may control the memory device 400 to perform the test read operation by applying the test read voltage to the selected word line under control of the memory controller. For example, the control logic 450 may control the voltage generator 440 to generate a test read voltage, and provide a row address X-ADDR to the row decoder 430.

The input/output (I/O) circuit 460 may be connected to the page buffer circuit 420 through the data lines, may provide received data DATA to the page buffer circuit 420, or may output data DATA provided from the page buffer circuit 420 to an external area.

The cell counter 470 may receive page buffer signals from the page buffer circuit 420, and may, based on the received page buffer signals, perform cell counting operations. For example, while the memory controller performs the optimum voltage setting operation, after the test read voltage is applied to the word lines, the cell counter 470 may perform the cell counting operation. The cell counter 470 may provide the cell count information CC, which indicates results according to the cell count operation, to the memory controller 300 arranged outside of the memory device 400. The cell counter 470 may be implemented as a component separate from the control logic 450, and may also be implemented as a part of the control logic 450.

According to an example embodiment, while the memory controller 300 performs the optimum voltage setting operation, the memory device 400 may perform the test read operation by using the test read voltage, and may provide the cell count information CC to the memory controller 300 arranged outside the memory device 400, by performing the cell counting operation with respect to data read by performing the test read operation.

Figure 4B:
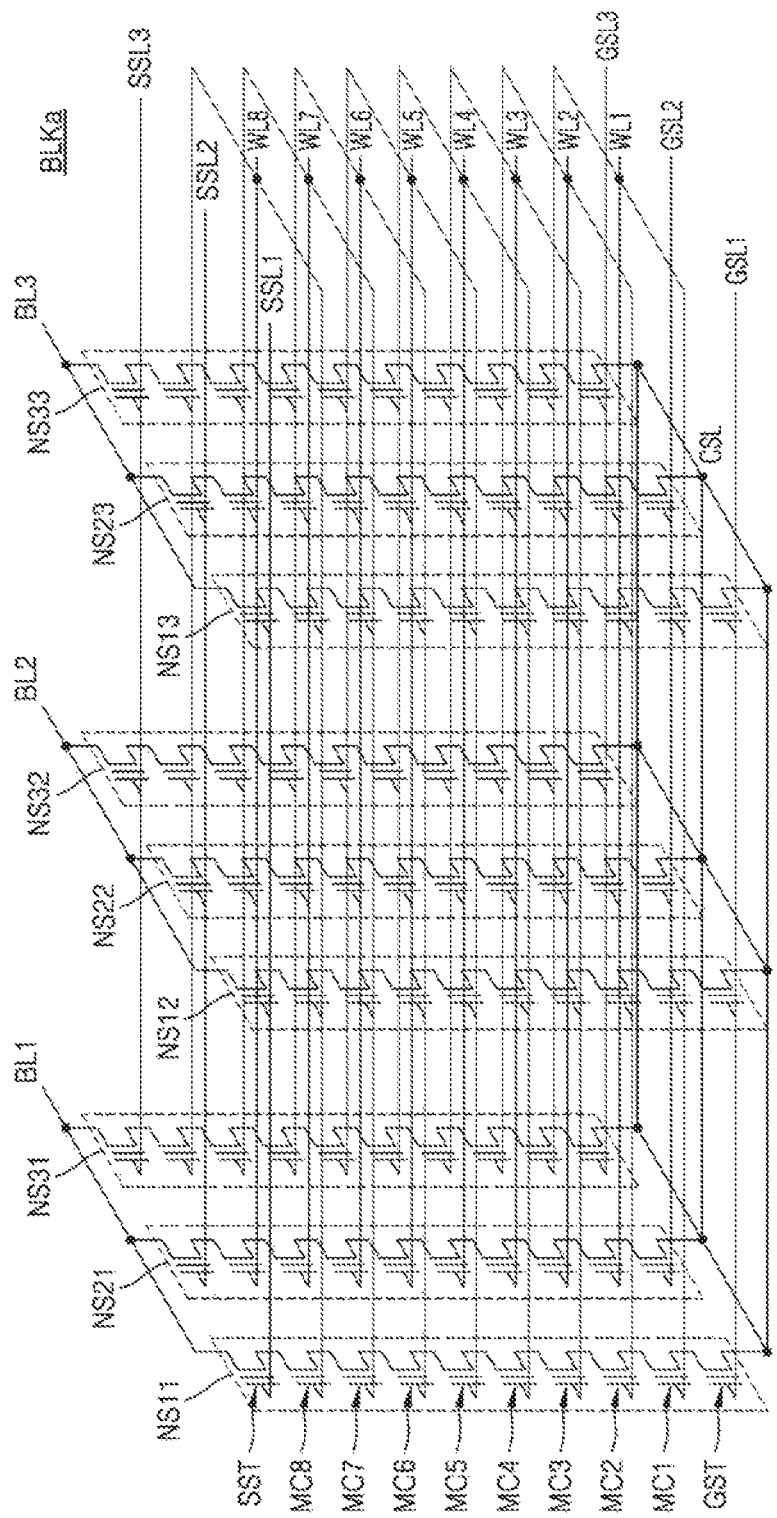

FIGS. 4A and 4B respectively show a memory block BLKa according to an example embodiment. Each of the plurality of memory blocks BLK1 through BLKz, which are included in the memory cell array 410 of FIG. 3, may be configured similarly to the memory block BLKa shown in FIGS. 4A through 4B.

Referring to FIG. 4A, the memory block BLKa may, in a direction of bit lines BL0 through BLd−1, include d (d is a natural number equal to or greater than 2) cell strings CSTRs in which eight memory cells are serially connected. Each of the cell strings CSTRs may include a string selection transistor SST and a ground selection transistor GST respectively connected to two opposite ends of the memory cells MCELs that are serially connected. Also, the string selection transistor SST may be connected to the string selection line SSL, and the ground selection transistor GST may be connected to the ground selection line GSL.

In NAND flash memory having a structure like in shown FIG. 4A, erase operations may be performed in block units, and write operations may be performed in physical page PAG units corresponding to the word lines WL0 through WL7. FIG. 4A shows a case in which eight pages PAGs for eight word lines WL0 through WL7 are included in one block. However, the number of the memory cells and the number of pages, included in the blocks of the memory cell array according to some embodiments, may be different from the number of memory cells MCELs and the physical page PAG shown in FIG. 4A.

Referring to FIG. 4B, the memory block BLKa may include a plurality of NAND strings NS11 through NS33, a plurality of ground selection lines GSL1 through GSL3, a plurality of string selection lines SSL1 through SSL3 and the common source line CSL. Here, the number of the NAND strings, the number of the word lines, the number of bit lines, the number of the ground selection lines, and the number of the string selection lines may vary according to embodiments.

The NAND strings NS11, NS21, and NS31 may be provided between a first bit line BL1 and the common source line CSL, the NAND strings NS12, NS22, and NS32 may be provided between a second bit line BL2 and the common source line CSL, and the NAND strings NS13, NS23, and NS33 may be provided between a third bit line BL3 and the common source line CSL. Each of the NAND strings (for example, NS11) may include the string selection transistor SST, a plurality of memory cells MC, and the ground selection transistor that are serially connected to one another.

The string selection transistor SST may be connected to corresponding string selection lines SSL1 through SSL3. The plurality of memory cells MC may respectively be connected to corresponding word lines WL1 through WL8. The ground selection transistor GST may be connected to corresponding ground selection lines GSL1 through GSL3. The string selection transistor SST may be connected to corresponding bit lines BL1 through BL3, and the ground selection transistor GST may be connected to the common source line CSL.

Although, in FIG. 4B, each of the strings is illustrated as including one string selection transistor SST, the inventive concept is not limited thereto, and each of the strings may include an upper string selection transistor and a lower string selection transistor that are serially connected to the strings. Also, in FIG. 4B, although each of the strings is illustrated as including one ground selection transistor GST, the inventive concept is not limited thereto, and each of the strings may include an upper ground selection transistor and a lower ground selection transistor that are serially connected to the strings. In this case, the upper ground selection transistors may be connected to corresponding ground selection lines GSL1 through GSL3, and the lower ground selection transistors may be connected, in common, to a common ground selection line.

Figure 5:
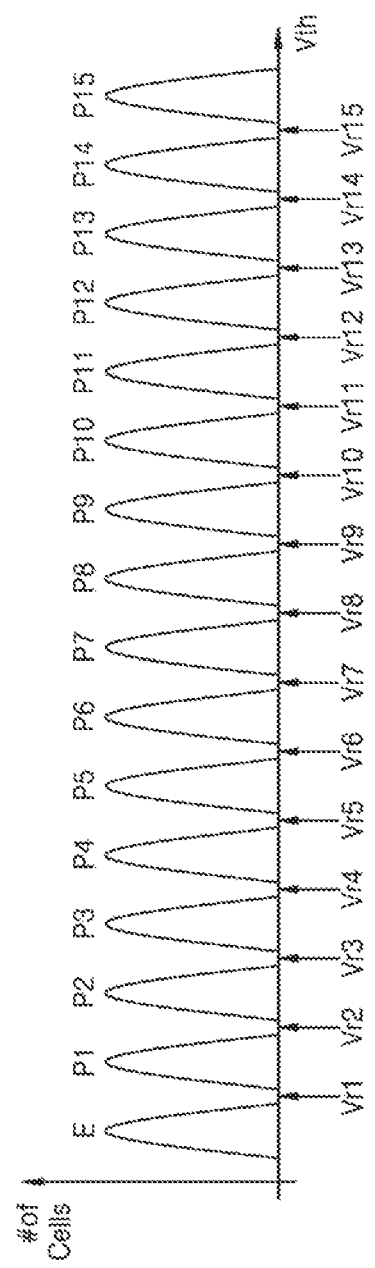
FIG. 5 shows a threshold voltage distribution of memory cells, according to an example embodiment.

FIG. 5 shows a threshold voltage distribution of the memory cells according to an example embodiment. More particularly, FIG. 5 shows the threshold voltage distribution of a case in which the memory cells are quadruple cells QLCs respectively storing 4 bits of data.

Referring to FIG. 5, a horizontal axis indicates a threshold voltage Vth, and a vertical axis indicates the number of the memory cells. Each of the memory cells may have a state from among an erase state E and a first program state P1 through a fifteenth program state P15. As the states of the memory cells are changed from the erase state E to the fifteenth program state P15, more electrons may be injected into floating gates of the memory cells.

A first read voltage Vr1 may have a voltage level between a distribution of memory cells under the erase state E and a distribution of memory cells under the first program state P1. Likewise, an $i^{th}$ read voltage Vri (i is a natural number equal to or greater than 2 and less than or equal to 15) may have a voltage level between a distribution of memory cells under an $i-1^{th}$ program state Pi−1 and a distribution of memory cells under $i^{th}$ program state Pi.

The first read voltage Vr1 through the fifteenth read voltage Vr15 are read voltages used for distinguishing memory cells under different program states. For convenience of explanation, the first read voltage Vr1 through the fifteenth read voltage Vr15 will be referred to as read voltages having different levels. In other words, the first read voltage Vr1 through the fifteenth read voltage Vr15 are read voltages having different read voltage levels.

Figure 6:
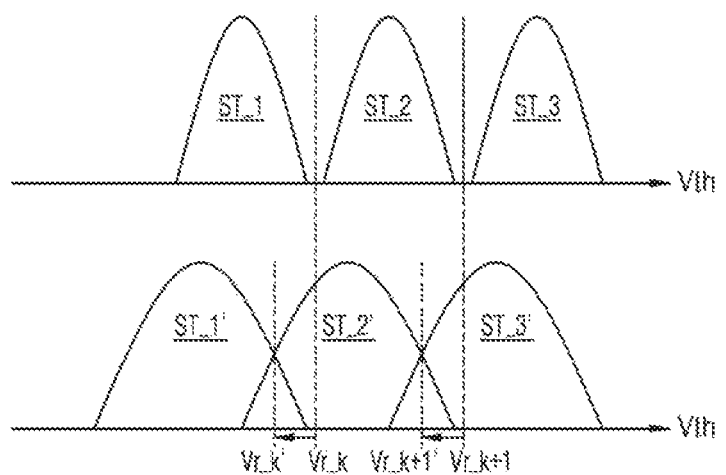
FIG. 6 shows threshold voltage distributions of memory cells before and after distribution degradation, according to an example embodiment.

FIG. 6 shows threshold voltage distributions of the memory cells before and after distribution degradation according to an example embodiment. For convenience of explanation, a threshold voltage distribution having three continuous program states, among the plurality of program states like shown in FIG. 5, will be described.

Before degradation of the distribution, the memory cells may generate threshold voltage distributions such as a first state ST_1, a second state ST_2, and a third state ST_3. The first state ST_1, the second state ST_2, and the third state ST_3 respectively represents three continuous program states. For example, when the second state ST_2 is a $k^{th}$ program state, a read voltage to distinguish memory cells in the second state ST_2 may be a $k^{th}$ read voltage Vr_k, and a read voltage to distinguish memory cells in the third state ST_3 may be a $k+1^{th}$ read voltage Vr_k+1. In an example embodiment, right after being programmed, the memory cells may form threshold voltage distributions having program states such as the first state ST_1, the second state ST_2, and the third state ST_3.

When the distributions are degraded due to various causes, the memory cells may form threshold voltage distributions such as a degraded first state ST_1', a degraded second state ST_2', and a degraded third state ST_3'. Under degraded threshold voltage distributions, when the $k^{th}$ read voltage Vr_k is applied to the word lines WLs to distinguish the degraded second state ST_2', it is difficult to expect a proper read operation. Accordingly, in this case, a read voltage is newly set, that is, from the $k^{th}$ read voltage Vr_k to a changed $k^{th}$ read voltage Vr_k'. Likewise, to distinguish the degraded third state ST_3', a read voltage is newly set, that is, from the $k+1^{th}$ read voltage Vr_k+1 to a changed $k+1^{th}$ read voltage Vr_k+1'. As described above, an operation of newly setting a read voltage, for proper read operations under the degraded threshold voltage distributions of the memory cells, may be referred to as an operation of setting an optimum read voltage.

Figure 7:
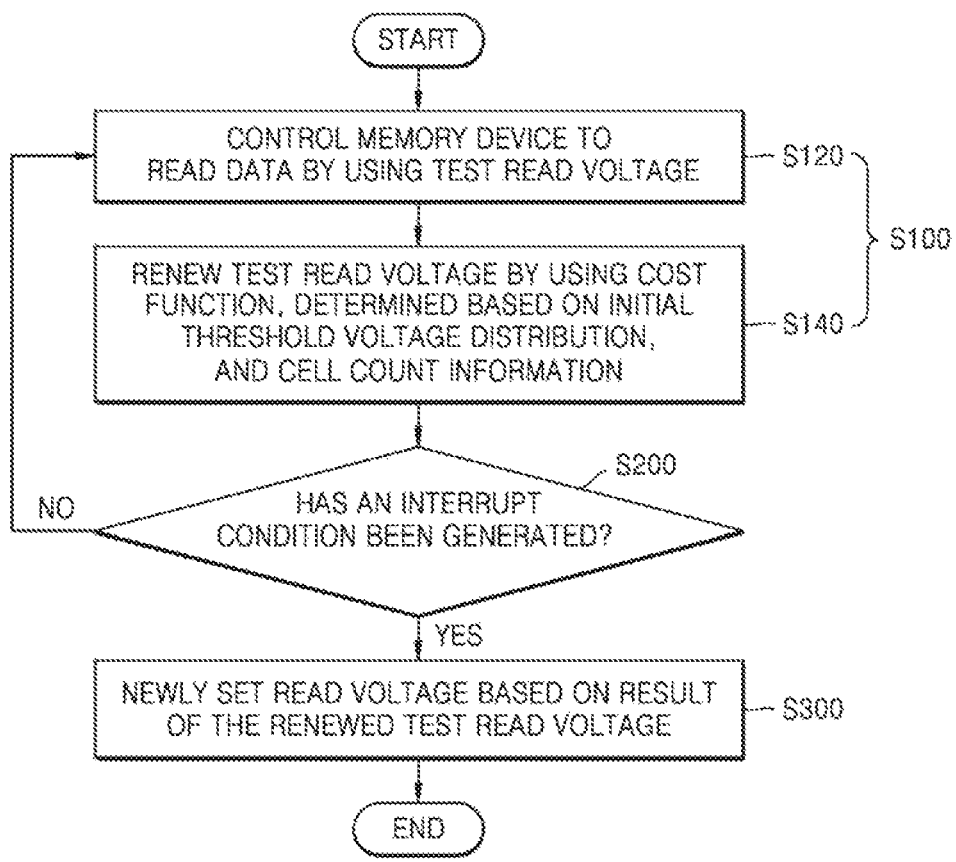
FIG. 7 is a flowchart of a method of setting a read voltage of a memory controller according to an example embodiment.

FIG. 7 is a flowchart of a method of setting a read voltage of the memory controller 300 according to an example embodiment. FIG. 7 is described with reference to FIGS. 1 and 2.

The memory controller 300 may control the memory device 400 to read data by using a test read voltage (S120). In an example embodiment, an initial test read voltage may have an arbitrary value. However, in a non-limiting example embodiment, as described with reference to FIG. 6, when a read voltage that is used to distinguish the second state ST_2 is newly set, an initial test read voltage value may be the $k^{th}$ read voltage Vr_k, that is, the read voltage before the distribution degradation.

The memory controller 300 may, by receiving the cell count information CC from the memory device 400, renew the test read voltage by using the cost function, which is determined based on the initial threshold voltage distribution of the memory cells and the cell count information CC (S140). In an example embodiment, the memory controller 300 may, based on a slope value of the cost function for voltages, renew the test read voltage by performing numerical analysis with respect to a function value calculated by using the cell count information CC and the cost function. The renewal of the test read voltage will be described in more detail with reference to the attached drawings.

The memory controller 300 may perform operation S100, which includes the operations S120 and S140, at least once. Alternatively, the memory controller 300 may recursively perform the operation S100 several times. In this case, one time of the operation S100 may be referred to as an iteration loop. When the memory controller 300 performs the operation S100 several times, a test read voltage used in the operation S120 of the $i+1^{th}$ iteration loop may be the test read voltage renewed in the operation S140 of the $i^{th}$ iteration loop. The memory controller 300 may repeat the operation S100 until an interruption condition is caused.

The memory controller 300 may identify whether an interruption condition has been generated (S200). In an example embodiment, the interruption condition may include a case in which the number of repetition of the operation S100 is equal to a certain target number of times, and an example embodiment thereof will be described with reference to FIG. 14. In another example embodiment, the interruption condition may include a case in which a gap between the test read voltage before renewal and the test read voltage after renewal is less than a threshold value, and an example embodiment thereof will be described with reference to FIG. 15. In another example embodiment, the interruption condition may include a case in which the number of repetitions of the controlling of the memory device is equal to a certain target number of times or a case in which the gap between the test read voltage before the renewal and the test read voltage after the renewal is less than the threshold value. That is, more than one of the various interruption conditions described above may be used. When the interruption condition has not been generated, the operation S100 is performed again, and when the interruption condition has been generated, operation S300 is performed.

When the interruption condition has been generated, the memory controller 300 may, based on a result of the renewal of the test read voltage, newly set a read voltage (S300). For example, the memory controller 300 may determine a test read voltage when the iteration interruption condition has been generated, as a new read voltage.

Figure 8:
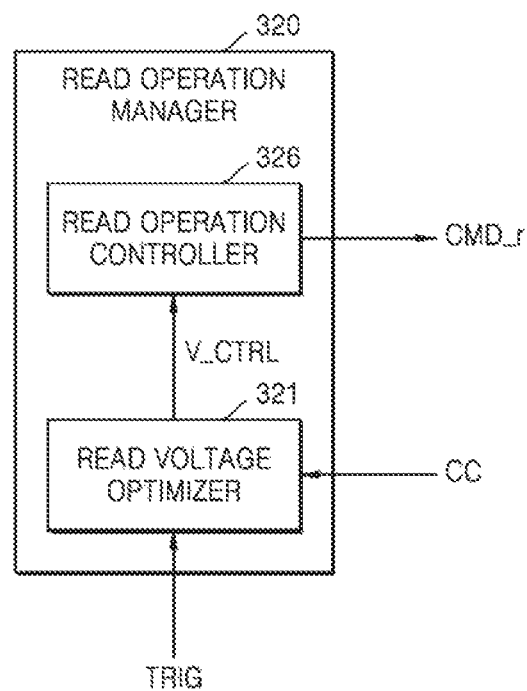
FIG. 8 shows a read operation manager according to an example embodiment.

FIG. 8 shows the read operation manager 320 according to an example embodiment. The read operation manager 320 may include a read voltage optimizer 321 and a read operation controller 326. In the description of the read operation manager 320, descriptions overlapping with those of FIGS. 1 and 2 are omitted for conciseness. FIG. 8 is described with reference to FIGS. 1 and 2.

The read voltage optimizer 321 may, based on a trigger signal TRIG, perform an operation of setting an optimum read voltage. The trigger signal TRIG is a signal that renders the memory controller 300 to perform the operation of setting the optimum read voltage. For example, when the ECC engine 370 detects data including UECC errors, the ECC engine 370 may provide a trigger signal TRIG to the read voltage optimizer 321. The read voltage optimizer 321 may provide information about the test read voltage to the read operation controller 326 as a voltage control signal V_CTRL so that the read operation controller 326 may control the test read operation of the memory device 400. The read voltage optimizer 321 may, by receiving the cell count information CC from the memory device 400 according to the test read voltage of the memory device 400, renew the test read voltage V_TEST by using the cost function, determined based on the initial threshold voltage distribution of the memory cells, and the cell count information CC. The read voltage optimizer 321 may detect whether the iteration interruption condition is generated, and when the iteration interruption condition is generated, the read voltage optimizer 321 may newly set a read voltage, and may provide information about the newly set read voltage as a voltage control signal V_CTRL to the read operation controller 326.

The read operation controller 326 may control read operations of the memory device 400. For example, the read operation controller 326 may, by providing a read command CMD_r to the memory device 400, control the memory device 400 to perform a read operation. However, the generating of the read command CMD_r is not limited thereto, and the memory controller 300 may include an extra command generation module, and the read operation controller 326 may control the command generation module to generate a read command CMD_r. In the iteration loop renewing the test read voltage, the read operation controller 326 may control the test read operation of the memory device 400 based on a voltage control signal V_CTRL including information about the test read voltage provided by the read voltage optimizer 321. After the optimum read voltage setting operation by the memory controller 300 is completed, the read operation controller 326 may control read operations of the memory device 400 based on a voltage control signal V_CTRL including information about a newly set read voltage provided by the read voltage optimizer 321.

Figure 9A:
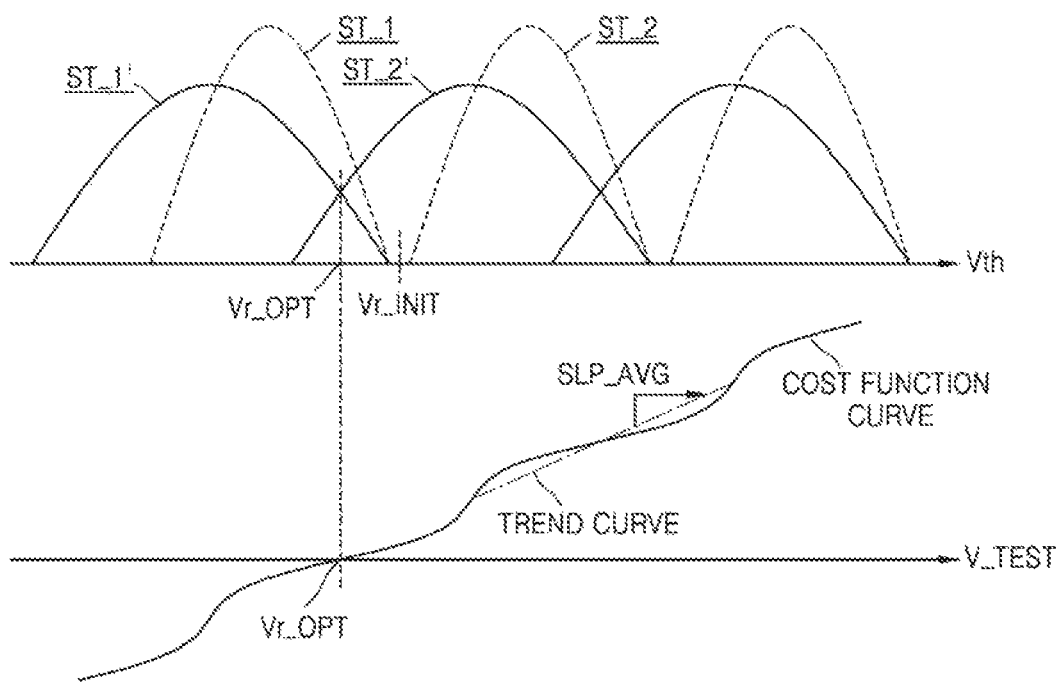
FIG. 9A shows a threshold voltage distribution and a cost function of memory cells, according to an example embodiment.

FIG. 9A shows threshold voltage distributions and a cost function of the memory cells according to example embodiments. For convenience of explanation, FIG. 9A shows three program states, which are adjacent one another, including a first state ST_1 and a second state ST_2. FIG. 9A is described with reference to FIGS. 1 and 2.

The memory cells forming the initial threshold voltage distributions of the first state ST_1 and the second state ST_2, due to degradation of the threshold voltage distributions, may form threshold voltage distributions of a degraded first state ST_1' and a degraded second state ST_2'. Accordingly, an optimum read voltage Vr_OPT, which is different from an initial read voltage Vr_INIT used to distinguish the second state ST_2 from the first state ST_1, may be newly set. To renew the optimal read voltage, the memory controller 300 may perform an operation of setting an optimum read voltage.

The memory controller 300 may, during the operation of setting the optimum read voltage, use a cost function determined based on the initial threshold voltage distributions of the memory cells. Hereinafter, for convenience of explanation, a cost function for setting the optimum read voltage Vr_OPT, for distinguishing the degraded second state ST_2' from the degraded first state ST_1, will be described.

The cost function used for setting the optimum read voltage Vr_OPT may be a function for the test read voltage V_TEST or voltages. For example, the cost function may be a function calculated by subtracting the number of memory cells having a program state lower than or equal to a first state in the initial threshold voltage distributions from cell counting information CC obtained from cell counting operation according to performance of the test read operation by using the test read voltage of the memory device 400. The cell count information CC may indicate the number of on-cells counted after the memory device 400 has applied the test read voltage to the word lines. Since the cell count information is a value that changes according to a value of the test read voltage, the cost function also is a function having the values of the test read voltages as a factor. For example, when the first state ST_1 is a seventh program state P7 of FIG. 5, a cost function for setting an optimal read voltage Vr_OPT may be a function calculated by subtracting the number of memory cells having program states of the erase state E and the first program state P1 through the seventh program state through P7, in the initial threshold voltage distributions, from the cell count information CC.

Figure 10:
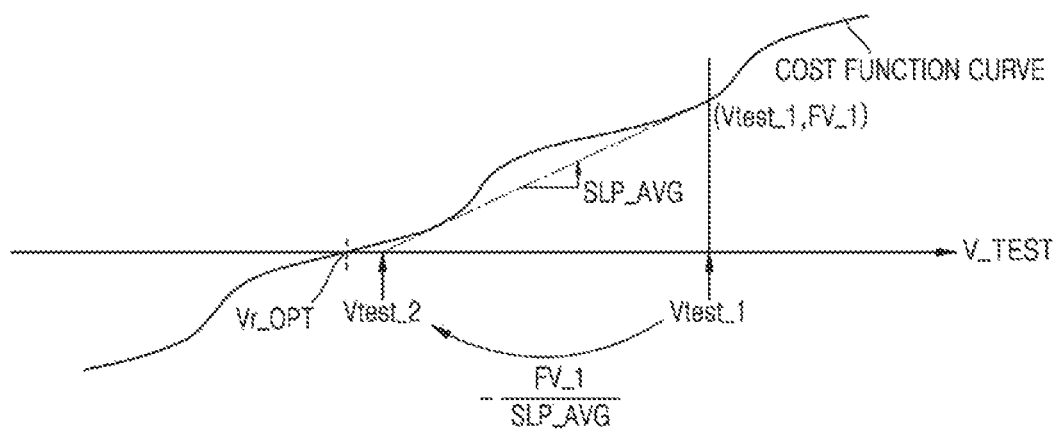
FIG. 10 shows a cost function of a test read voltage, according to an example embodiment.

A graph of the cost function determined in this manner may indicate a cost function curve shown in a lower portion of FIG. 9A. In other words, when the test read voltage V_TEST is equal to the optimal read value Vr_OPT, the function value '0' of the cost function may be 0, or may substantially have a value near '0'. Accordingly, the determining of the optimum read voltage Vr_OPT is concluded to a matter of finding a solution for a test read voltage V_TEST in which a function value of the cost function, which is an unknown function, is 0. The memory controller 300 may, based on the slope value of the cost function for the voltages, renew the test read voltage by performing numeral analysis with respect to a function value calculated by using the cell count information CC and the cost function. The slope value of the cost function may indicate a slope of a trend curve of a cost function curve. In other words, the slope value of the cost function may indicate an average slope SLP_AVG of the cost function curve. A method of renewing the test read voltage, based on the slope value of the cost function, will be more fully described with reference to FIG. 10 shown below.

Figure 9B:
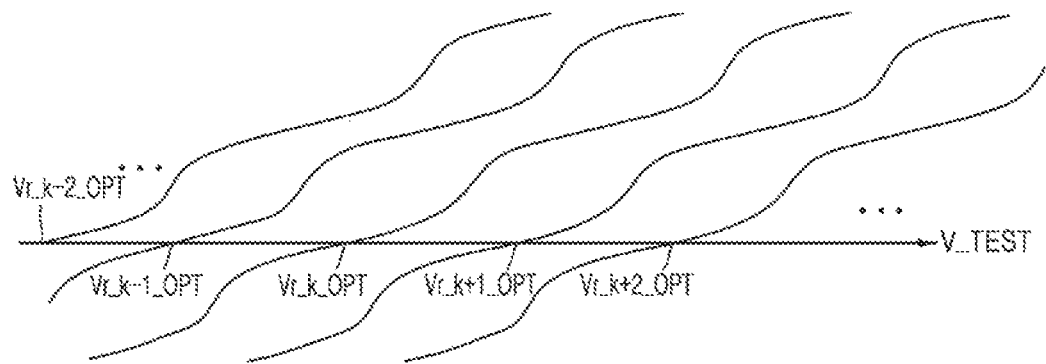
FIG. 9B shows cost functions determined for different read voltage levels, according to an example embodiment.

FIG. 9B shows cost functions determined for different read voltage levels according to an example embodiment.

As described with reference to FIG. 9A, the cost function for determining the optimum read voltage Vr_OPT is a function for the test read voltage V_TEST, and when the test read voltage V_TEST is equal to the optimum read voltage Vr_OPT, the function value of the cost function may be '0'.

Referring to FIG. 9B, the cost function may be determined according to read voltage levels of the optimum read level to be found. For example, a cost function for determining an optimum $k^{th}$ read voltage Vr_k OPT may have a value of '0' when the test read voltage V_TEST is equal to the optimum $k^{th}$ read voltage Vr_k OPT. As another example, a cost function for determining an optimum $k+1^{th}$ read voltage Vr_k+1 OPT may have a value of '0' when the test read voltage V_TEST is equal to the optimum $k+1^{th}$ read voltage Vr_k+1 OPT.

FIG. 10 shows a cost function for the test read voltage V_TEST according to an example embodiment. FIG. 10 is described with reference to FIGS. 1, 2, and 9A.

In the operation of setting the optimum read voltage Vr_OPT for distinguishing the degraded second state ST_2' from the degraded first state ST_1' of FIG. 9A, a method of renewing the test read voltage is described.

The memory controller 300 may control the memory device 400 to perform a test read operation by using a first test read voltage Vtest_1. The memory controller 300 may, from the memory device 400, receive cell count information CC according to the test read operation. The memory controller 300 may calculate a first function value FV_1 by using cost function and cell count information CC determined based on the initial threshold voltage distributions of the memory cells. For example, the memory controller 300 may calculate the first function value FV_1 by putting the cell count information CC into the cost function. For example, the memory controller 300 may calculate the first function value FV_1 by subtracting the number of memory cells, having program states lower than the first state ST_1 on the initial threshold voltage distributions, from the cell count information CC.

The memory controller 300 may perform numerical analysis on the first function value FV_1 based on the slope value of the cost function for voltages. For example, the memory controller 300 may perform Newton-Raphson numerical analysis with respect to the first function value FV_1. The Newton-Raphson numerical analysis, which is a mathematical algorithm used for finding a solution of an unknown function or a nonlinear equation, is a method of finding a value close to a solution by performing iteration operations of finding new factor values, after finding a function value by putting an arbitrary initial value in, by using the function value and a slope value of the function. Referring to FIG. 10, the memory controller 300 may renew the test read voltage, based on the first function value FV_1 and the average slope SLP_AVG of the cost function curve. The memory controller 300 may obtain a second read voltage Vtest_2, by subtracting a value obtained by dividing the first function value FV_1 by the average slope SLP_AVG from the first test read voltage Vtest_1.

By repeating the renewing of the test read voltage as described above, the memory controller 300 may obtain a value of the optimum read voltage Vr_OPT, and may distinguish the degraded second state ST_2' from the degraded first state ST_1' even under degradation of the threshold voltage distribution, by controlling the memory device 400 to perform the read operation by using the optimum read voltage Vr_OPT.

Figure 11:
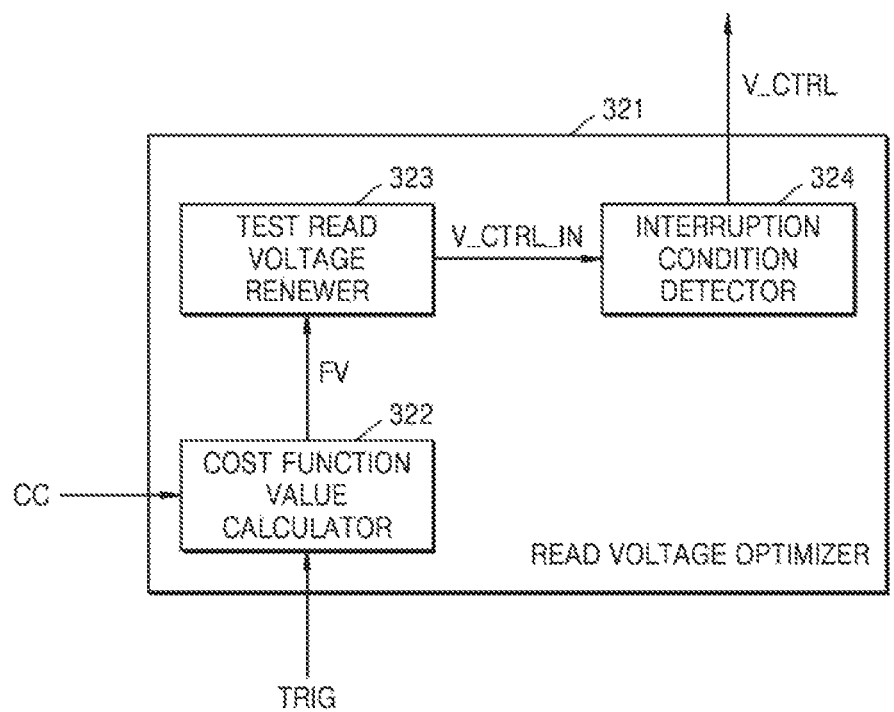
FIG. 11 shows a read voltage optimizer according to an example embodiment.

FIG. 11 shows the read voltage optimizer 321 according to an example embodiment. The read voltage optimizer may include a cost function value calculator 322, a test read voltage renewer 323, and an interruption condition detector 324. In the description of the read voltage optimizer 321, descriptions overlapping with FIG. 8 are omitted for conciseness. FIG. 11 is described with reference to FIGS. 1 and 2.

The cost function value calculator 322 may generate a function value FV, based on the cost function and the cell count information CC determined based on the initial threshold voltage of the memory cells. For example, the cost function value calculator 322 may generate a function value FV by putting cell count information CC into the cost function. The cost function value calculator 322 may provide the generated function value FV to the test read voltage renewer 323. In determining the cost function and generating the function value, the cost function value calculator 322 may use the initial threshold voltage distribution information ITD_INFO. The initial threshold voltage distribution information ITD_INFO will be described in more detail with reference to FIGS. 12A and 12B.

The test read voltage renewer 323 may renew the test read voltage V_TEST by performing numerical analysis on the function value FV received from the cost function value calculator 322. For example, the test read voltage renewer 323 may renew the test read voltage V_TEST by performing Newton-Raphson numerical analysis with respect to the function value FV. The test read voltage renewer 323 may provide an internal voltage control signal V_CTRL_IN, including information about the test read voltage V_TEST that has been renewed, to the interruption condition detector 324.

The interruption condition detector 324 may identify whether an iteration interruption condition has been generated during the optimum read voltage setting operation by the memory controller 300. When the iteration interruption condition is generated, the interruption condition detector 324 may determine the test read voltage V_TEST as the optimum read voltage Vr, and provide the optimum read voltage Vr to the read operation controller 326. When the iteration interruption condition is not generated, the interruption condition detector 324 may provide the test read voltage V_TEST to the read operation controller 326 so that the read operation controller 326 may control the test read operation of the memory device 400. The interruption condition detector 324 may generate information about the determined voltage as a voltage control signal V_CTRL.

FIGS. 12A and 12B show the initial threshold voltage distribution information ITD_INFO. The initial threshold voltage distribution information ITD_INFO may include information about the threshold voltage distributions formed by the memory cells in an initial state before distribution degradation. FIGS. 12A and 12B are described with reference to FIGS. 1 and 2.

Referring to FIG. 12A, the initial threshold voltage distribution information ITD_INFO may include a lookup table including reference cell count information corresponding to a plurality of program states. In an example embodiment, the reference cell count information may indicate the number of memory cells under each program state. In this case, for example, in an operation of setting an optimum read voltage to distinguish a seventh program state P7 from a sixth program state P6, the cost function value calculator 322 of FIG. 11 may calculate a function value FV by subtracting a sum of first reference cell count CC_REF_1 through seventh reference cell count CC_REF_7, which is the number of memory cells having program states less than or equal to the sixth program state, from the cell count information CC. However, the reference cell count information is not limited thereto, and in an example embodiment, the reference cell count information may indicate the number of memory cells in program states lower than or equal to respective program states. In this case, for example, in an operation of setting an optimum read voltage to distinguish a seventh program state P7 from a sixth program state P6, the cost function value calculator 322 of FIG. 11 may calculate a function value FV by subtracting seventh reference cell count CC_REF_7, from the cell count information CC.

Referring to FIG. 12B, the initial threshold voltage distribution information ITD_INFO may include a lookup table including reference cell count information corresponding to a plurality of word lines. When the randomizer 380 performs randomizing operations with respect to the respective word lines, memory cells connected to the respective word lines may impartially generate erase states and a plurality of program states. Accordingly, the memory controller 300 may store only the number of memory cells in each program state. In this case, for example, in an operation of setting an optimum read voltage for distinguishing a seventh program state P7 with respect to a second word line WL2 from a sixth program state P6, the cost function value calculator 322 of FIG. 11 may calculate a function value FV by subtracting a value of multiplying 7 by second reference cell count that is the number of memory cells having program states lower than or equal to the sixth program P6, from the cell count information CC.

Figure 13:
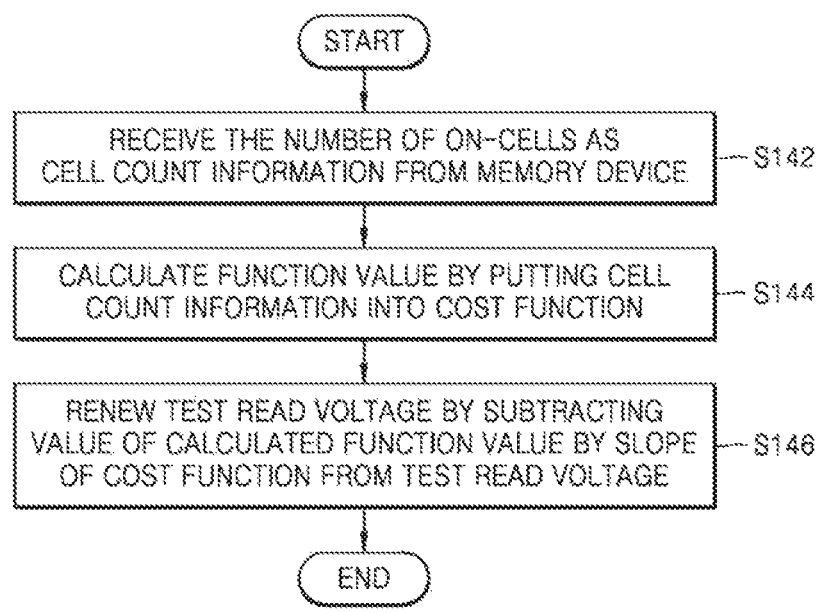
FIG. 13 shows a flowchart of a method of renewing a test read voltage, according to an example embodiment.

FIG. 13 shows a flowchart of a method of renewing the test read voltage according to an example embodiment. FIG. 13 may be a flowchart of the operation S140 of FIG. 7. FIG. 13 is described with reference to FIGS. 1 and 2.

The memory controller 300 may, from the memory device 400, receive the number of on-cells as cell count information CC (S142). For example, as a result of performing cell count operation with respect to data read by performing the test read operation of the memory device 400 by using the test read voltage, the memory controller 300 may receive the number of on-cells as the cell count information CC.

The memory controller 300 may, by putting the received cell count information CC into the cost function, calculate the function value FV of the cost function (S144). For example, in an operation of setting the optimum read voltage for distinguishing the degraded second state ST_2' from the degraded first state ST_1', as described with reference to FIG. 9A, the cost function value calculator 322 of FIG. 11 may calculate a function value FV by subtracting the number of memory cells in program states lower than or equal to the first state ST_1 of FIG. 9A from the cell count information CC.

The memory controller 300 may renew the test read voltage by subtracting a value, calculated by the calculated function value FV by the slope of the cost function, from the test read voltage (S146). For example, the slope of the cost function may indicate an average slope of the cost function curve. However, the slope of the cost function is not limited thereto, and the memory controller 300 may, based on the number of repetitions of the iteration loop, apply other values to the slope of the cost function. For example, the memory controller 300 may apply smaller slope values as the number of repetitions increases, and the memory controller 300 may also store slope information of the cost function corresponding to the number of repetitions.

Figure 14:
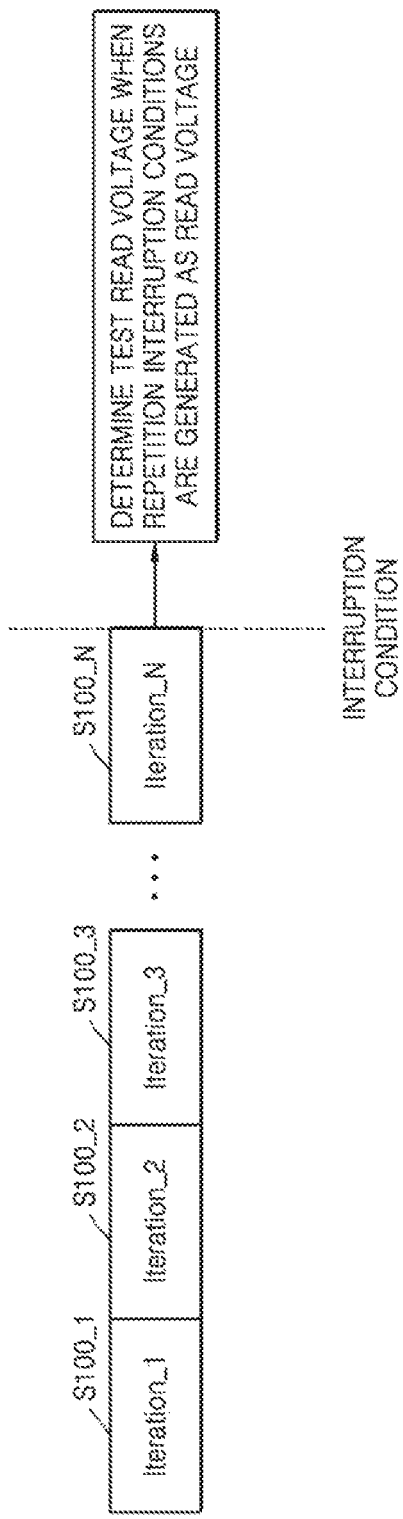
FIG. 14 is a flowchart of operations of a memory controller when an iteration interruption condition is generated, according to an example embodiment.

FIG. 14 is a flowchart of operations of the memory controller 300 when an iteration interruption condition is generated, according to an example embodiment. In particular, FIG. 14 shows an example embodiment of the interruption condition of the iteration loop. FIG. 14 is described with reference to FIGS. 1 and 2.

In an example embodiment, the interruption condition may include a case in which the number of repetitions of the iteration loop is equal to a target number of repetitions. The target number of repetitions may be a fixed value. Alternatively, the target number of repetitions may be a value that may be differently determined according to conditions of the memory controller 300. For example, as the memory controller 300 has longer time allocable to the operation of setting the optimum read voltage, the target number may have a greater value. A case in which the target number of times is N (N is a natural number) is assumed and described.

When the operation S100 of FIG. 7 is an iteration loop, the memory controller 300 may recursively perform the operation S100 until the number of repetitions of the iteration loop becomes N. In other words, as described in FIG. 14, a first iteration loop S100_1 through an $N^{th}$ iteration loop S100_N may be performed. After the $N^{th}$ iteration loop S100_N is performed, the memory controller 300 may detect that the interruption condition has been generated (i.e., that the number of repetitions completed is equal to N). When it is detected that the interruption condition is generated, the memory controller 300 may determine the test read voltage V_TEST, at the time when the interruption condition is generated, as a read voltage (S300).

Figure 15:
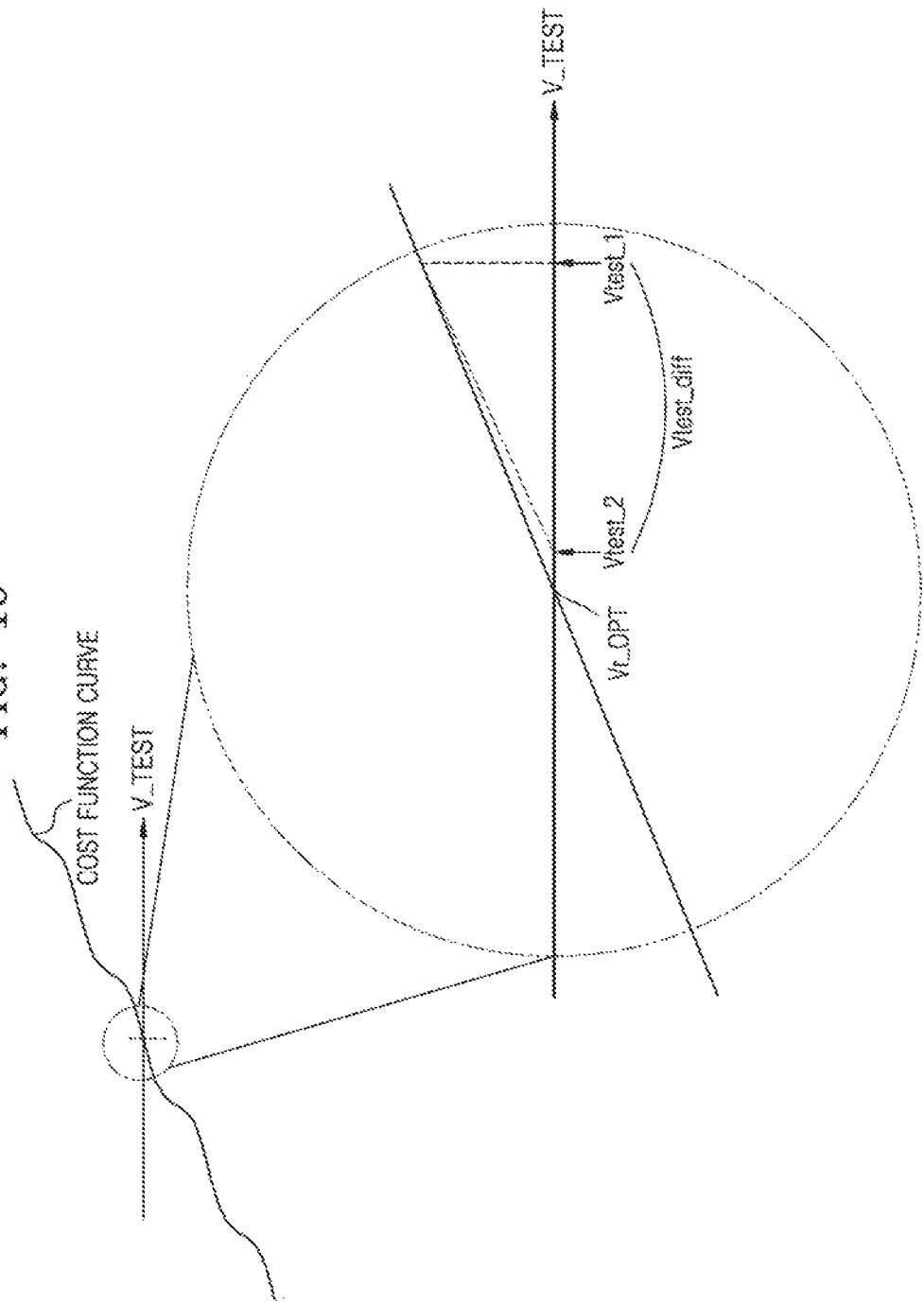
FIG. 15 is a cost function of a test read voltage for describing an iteration interruption condition, according to an example embodiment.

FIG. 15 describes a cost function for the test read voltage V_TEST, for describing an interruption condition, according to an example embodiment. In particular, FIG. 15 shows an example embodiment of an interruption condition for the iteration loop. FIG. 15 is described with reference to FIGS. 1 and 2.

In an example embodiment, the interruption condition may include a case in which a gap between the test read voltage before being renewed and the test read voltage after being renewed is less than a threshold value. FIG. 15 also shows a curve of an enlarged graph at a vicinity of the optimum read voltage Vr_OPT on the cost function curve. For example, for convenience of explanation, FIG. 15 shows a case in which the first test read voltage Vtest_1 is renewed as a second test read voltage Vtest_2, according to the operation S140 of FIG. 7.

The memory controller 300 may calculate a test read differential voltage Vtest_diff, indicating a gap between the first test read voltage Vtest_1, which is the test read voltage before the renewal, and the second read voltage Vtest_2, which is the test read voltage after the renewal. The memory controller 300 may determine whether the test read difference voltage Vtest_diff is less than the threshold value. When the test read differential voltage Vtest_diff is less than the threshold value, the memory controller 300 may stop the iteration loop, and may determine the renewed test read voltage at the time as the read voltage.

Figures 16, 17:
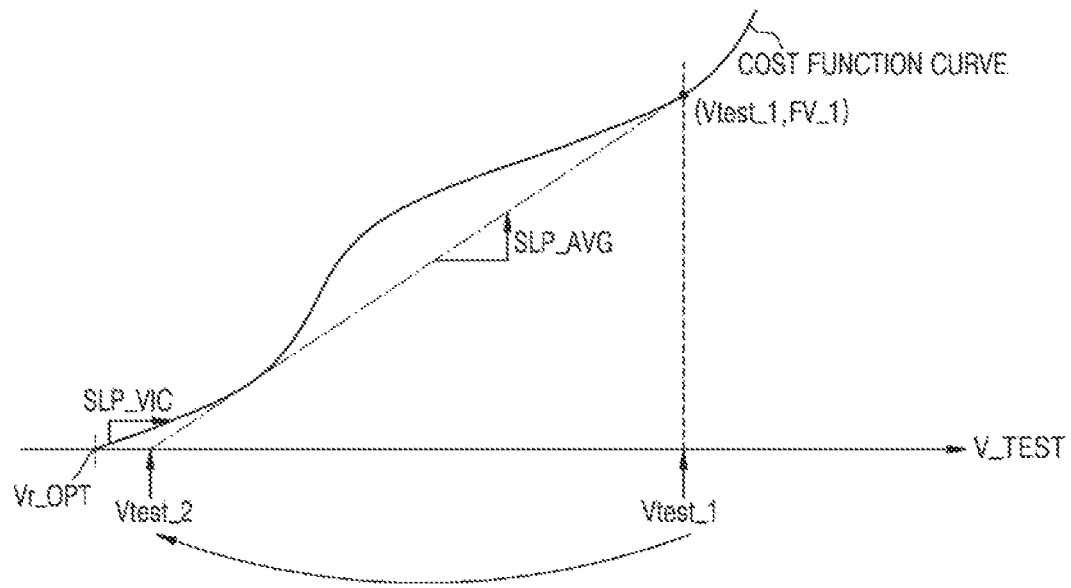
FIG. 16 shows a cost function of a test read voltage, according to an example embodiment.
FIG. 17 shows slope information according to an example embodiment.

FIG. 16 shows a cost function for the test read voltage V_TEST according to an example embodiment. FIG. 16 is described with reference to FIGS. 1 and 2.

For convenience of explanation, for example, in FIG. 16, there is assumed to be a case of renewing the first test read voltage Vtest_1 as the second test read voltage Vtest_2, by using the average slope SLP_AVG of the cost function curve, according to the operation S140 of FIG. 7. When the test read voltage is renewed to be the second test read voltage Vtest_2, the test read voltage may have a value close to a value of the optimum read voltage Vr_OPT. Accordingly, in the operation of renewing the test read voltage, when the slope value of the cost function is used as an optimum value vicinity slope SLP_VIC, instead of the average slope SLP_AVG, the optimum read voltage Vr_OPT may be more accurately found. In other words, the memory controller 300 may renew the test read voltage by differently applying the slope value of the cost function, based on the number of repetitions of the iteration loop. In this case, the memory controller 300 may, as the number of repetitions increases, apply smaller slope values to the slope value of the cost function. In addition, the memory controller 300 may store a lookup table including a plurality of slope values corresponding to a plurality of values of the number of repetitions, and details thereof will be described with reference to FIG. 17.

FIG. 17 shows slope information according to an example embodiment. FIG. 17 is described with reference to FIGS. 1 and 2.

The memory controller 300 may store the slope information SLP_INFO to differently apply the slope value of the cost function, according to the number of repetitions of the iteration loop (i.e., the number of iterations). The slope information SLP_INFO may include a lookup table including a plurality of slope values corresponding to a plurality of values of the number of repetitions.

For example, when the number of repetitions is 0, that is, in an initial iteration loop, the memory controller 300 may apply a first slope SLP_1 to the slope value of the cost function. As a non-limiting example, the first slope SLP_1 may be an average slope SLP_AVG of the cost function curve. Likewise, when the number of repetitions is 1, the memory controller 300 may apply a second slope SLP_2 to the slope value of the cost function. Also, the slope SLOPE may decrease from the first slope SLP_1 to a fourth slope SLP_4. In other words, the slope SLOPE may decrease as the number of iterations increases.

Figure 18:
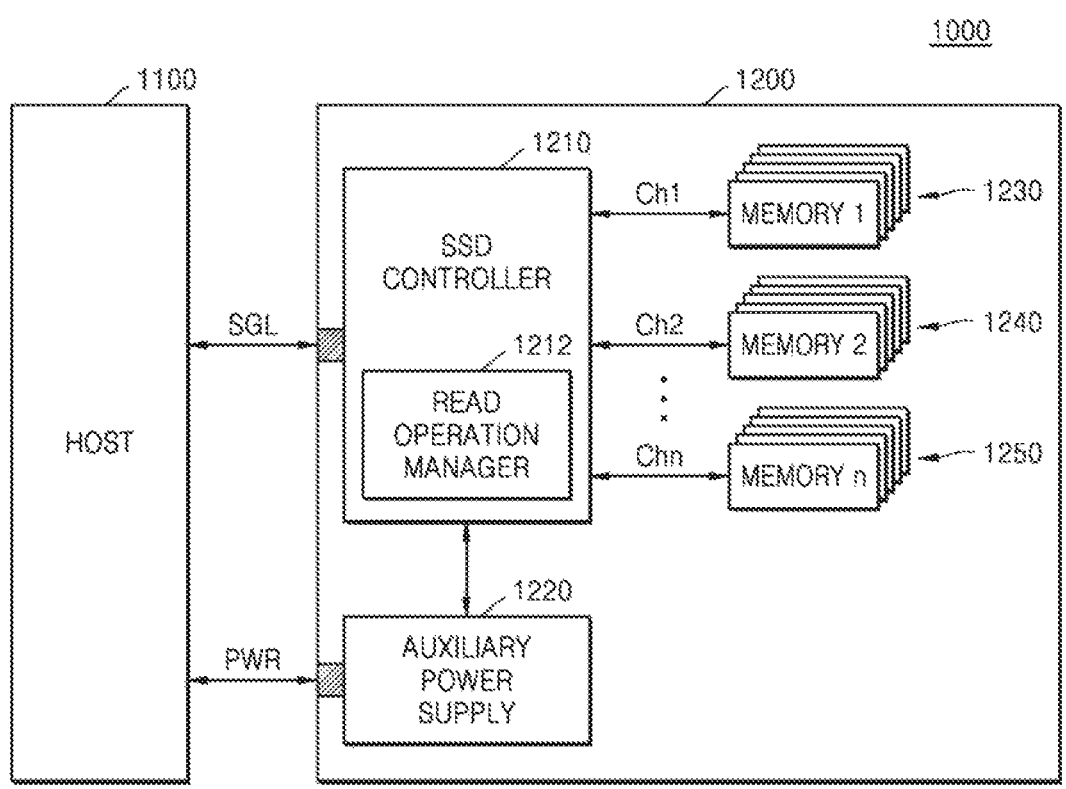
FIG. 18 shows a solid state drive (SSD) system according to an example embodiment.

FIG. 18 shows a solid state drive (SSD) system 1000 according to an example embodiment.

The SSD system 1000 may include a host 1100 and an SSD 1200. The SSD 1200 may, through a signal connector, exchange signals with the host 110, and may receive power input from a power connector. The SSD 1200 may include an SSD controller 1210, an auxiliary power supply 1220, and a plurality of memory devices 1230, 1240, and 1250. In this case, the SSD 1200 may be implemented according to the example embodiments shown in FIGS. 1 through 17.

In detail, according to the example embodiments shown in FIGS. 1 through 17, the SSD controller 1210 may include a read operation manager 1212. When the SSD controller 1210 detects data including UECC error with respect to a memory device among the plurality of memory devices 1230, 1240, and 1250, the read operation manager 1212 may perform an operation of setting the optimum read voltage. To perform the aforementioned operation, the read operation manager 1212 may control the memory device to perform the test read operation by using the test read voltage, and as cell count information is received from the memory device, the read operation manager 1212 may renew the test read voltage based on a cost function, determined based on an initial threshold voltage distribution of memory cells, and cell count information. By performing at least one iteration loop including the aforementioned operations, the read operation manager 1212 may set an optimum read operation. Accordingly, by performing read operations by using an optimum read voltage, the memory device may improve reliability of the read operations. Also, since the SSD controller 1210 may perform merely at least one iteration loop, the SSD controller 1210 may, according to the situation, flexibly perform the read voltage setting operation.

While the inventive concept has been particularly shown and described with reference to example embodiments thereof, it will be understood that various changes in form and details may be made therein without departing from the spirit and scope of the following claims.

What is claimed is:

1. A method of setting a read voltage by a memory controller, the method comprising:
   controlling a memory device to read data from a plurality of memory cells by applying a test read voltage to a selected word line;
   obtaining, based on a stored initial threshold voltage distribution of the plurality of memory cells, a cost function to find an optimum read voltage, the cost function being determined for each read voltage level;
   receiving, from the memory device, cell count information corresponding to a read operation of the memory device;
   renewing the test read voltage based on putting the cell count information into the cost function; and
   determining the read voltage of the memory device by performing the controlling of the memory device and the renewing of the test read voltage at least once.

2. The method of claim 1, wherein the controlling of the memory device and the renewing of the test read voltage are recursively performed until an interruption condition is generated, and
   the determining of the read voltage of the memory device comprises determining, as the read voltage of the memory device, the test read voltage at a time when the interruption condition is generated.

3. The method of claim 2, wherein the interruption condition comprises a case in which a number of repetitions of the controlling of the memory device and the renewing of the test read voltage is equal to a target number of repetitions.

4. The method of claim 2, wherein the interruption condition comprises a case in which a gap between the test read voltage before being renewed and the test read voltage after being renewed is less than a threshold value.

5. The method of claim 2, wherein the interruption condition comprises a case in which a number of repetitions of the controlling of the memory device and the renewing of the test read voltage is equal to a target number of repetitions, or a gap between the test read voltage before being renewed and the test read voltage after being renewed is less than a threshold value.

6. The method of claim 1, wherein the test read voltage is renewed by performing numerical analysis with respect to a function value that is calculated, based on a slope value of the cost function, by using the cell count information and the cost function.

7. The method of claim 6, wherein the cost function is a function calculated by subtracting a number of memory cells, among the plurality of memory cells, having a program state less than or equal to a first state in the stored initial threshold voltage distribution, from a number of on-cells counted after applying the test read voltage to the selected word line in the memory device, and
   the determining of the read voltage of the memory device comprises determining the read voltage to distinguish a second state from the first state, the second state neighboring the first state and having a second threshold voltage higher than a first threshold voltage of the first state in the memory device.

8. The method of claim 7, wherein the renewing of the test read voltage comprises:
   receiving, as the cell count information, the number of on-cells counted after the test read voltage is applied to the selected word line;
   calculating a first value of the cost function, by putting the cell count information into the cost function; and
   renewing the test read voltage by subtracting, from the test read voltage, a second value calculated by dividing the first value by the slope value of the cost function with respect to a voltage.

9. The method of claim 6, wherein the slope value of the cost function is stored in the memory controller.

10. The method of claim 6, wherein the renewing of the test read voltage comprises applying the slope value of the cost function differently based on a number of repetitions of the controlling of the memory device and the renewing of the test read voltage.

11. The method of claim 10, wherein as the number of repetitions increases, the renewing of the test read voltage applies a smaller value to the slope value of the cost function.

12. The method of claim 10, wherein the renewing of the test read voltage further comprises selecting the slope value corresponding to the number of repetitions by using a plurality of slope values corresponding to a plurality of values of the number of repetitions stored in the memory controller.

13. The method of claim 7, wherein the stored initial threshold voltage distribution is a threshold voltage distribution formed by a randomizer such that program states of the plurality of memory cells are equally in erase states and a plurality of program states.

14. A method of operating by a memory controller configured to control a memory device including a plurality of memory cells connected to a plurality of word lines, the method comprising:
   detecting one or more uncorrectable error correction code errors that have occurred in a selected word line among the plurality of word lines;
   performing at least one iteration loop until an interruption condition is generated, the at least one iteration loop being performed based on an arbitrary initial read voltage; and
   determining an optimum read voltage by using a result of the performing of the at least one iteration loop, and controlling the memory device to perform a read operation based on the optimum read voltage that is determined, wherein the at least one iteration loop comprises:
   controlling the memory device to perform a test read operation by applying a test read voltage to the selected word line;
   receiving, from the memory device, cell count information generated by the test read operation; and
   renewing the test read voltage based on putting the cell count information into a cost function, the cost function being determined based on a stored initial threshold voltage distribution of memory cells connected to the selected word line.

15. The method of claim 14, wherein, in response to the interruption condition being generated, the test read voltage at a time at which the interruption condition is generated is determined as the optimum read voltage.

16. The method of claim 14, wherein in an initially performed iteration loop among the at least one iteration loop, the arbitrary initial read voltage is used as the test read voltage.

17. The method of claim 14, wherein the test read voltage is renewed by performing Newton-Raphson numerical analysis on the cell count information, based on a slope value of the cost function with respect to a voltage.

18. A storage device comprising:
a memory device configured to perform a test read operation by applying a test read voltage to a selected word line, based on a read command signal received from a memory controller, and to transmit cell count information, by performing a cell counting operation according to a performance of the test read operation;
the memory controller configured to set an optimum read voltage of a plurality of memory cells, in an operation mode for setting the optimum read voltage of the plurality of memory cells connected to the selected word line, by recursively performing an operation set comprising renewing the test read voltage based on putting the cell count information received from the memory device into a cost function that is based on a stored initial threshold voltage distribution of the plurality of memory cells and that is determined for different read voltage levels, to find an optimum read operation of the memory device, and controlling the test read operation of the memory device based on the test read voltage that is renewed.

19. The storage device of claim 18, wherein the memory controller recursively performs the operation set until an interruption condition is generated, and in response to the interruption condition being generated, determines the test read voltage at a time at which the interruption condition is generated as the optimum read voltage.

20. The memory controller of claim 18, wherein the memory controller is further configured to set the optimum read voltage by performing Newton-Raphson numerical analysis for determining a solution of the test read voltage in which an accumulative distribution function of a threshold voltage distribution of the plurality of memory cells with respect to the test read voltage and a value of the cost function determined based on the stored initial threshold voltage distribution are '0'.

* * * * *